(12) United States Patent
Takahashi et al.

(10) Patent No.: US 9,383,773 B2
(45) Date of Patent: Jul. 5, 2016

(54) ELECTRONIC APPARATUS

(71) Applicant: KABUSHIKI KAISHA TOSHIBA, Minato-ku, Tokyo (JP)

(72) Inventors: Issei Takahashi, Tokyo (JP); Shigeo Hayashi, Tokyo (JP)

(73) Assignee: Kabushiki Kaisha Toshiba, Tokyo (JP)

(*) Notice: Subject to any disclaimer, the term of this patent is extended or adjusted under 35 U.S.C. 154(b) by 0 days.

(21) Appl. No.: 14/599,783

(22) Filed: Jan. 19, 2015

(65) Prior Publication Data

US 2016/0062401 A1 Mar. 3, 2016

(30) Foreign Application Priority Data

Aug. 29, 2014 (JP) ................................. 2014-176055

(51) Int. Cl.
*G06F 1/16* (2006.01)
*H05K 5/00* (2006.01)
*H05K 5/06* (2006.01)

(52) U.S. Cl.
CPC ............ *G06F 1/1632* (2013.01); *G06F 1/1669* (2013.01); *H05K 5/0017* (2013.01); *H05K 5/0086* (2013.01); *H05K 5/061* (2013.01)

(58) Field of Classification Search
USPC .............. 349/58, 60, 62; 361/679.01, 679.08, 361/679.09, 679.23, 679.27, 679.26, 361/679.33, 679.02, 679.2, 679.47, 679.49, 361/679.05, 679.21, 679.41, 679.42, 361/679.32; 248/231.91, 224.7, 27.1, 248/311.2, 157, 209, 917, 158, 317, 476, 248/220.41, 220.42; 312/223.6, 265.1, 312/234.4, 7.2, 209, 249.8, 326, 294, 223.1, 312/223.2; 455/575.4, 556.1, 575.8, 569.1, 455/575.2, 575.1, 575.6
See application file for complete search history.

(56) References Cited

U.S. PATENT DOCUMENTS

| 6,259,600 | B1 * | 7/2001 | Talbot | H05K 7/1431 361/679.47 |
| 6,914,773 | B2 * | 7/2005 | Yang | G06F 1/1609 361/679.02 |
| 7,855,875 | B2 * | 12/2010 | Takayanagi | G06F 1/1616 174/539 |
| 8,225,338 | B2 | 7/2012 | Miyagi et al. | |

FOREIGN PATENT DOCUMENTS

JP 8-211964 8/1996
JP 2011-221823 11/2011

* cited by examiner

*Primary Examiner* — Hung Duong
(74) *Attorney, Agent, or Firm* — Knobbe, Martens, Olson & Bear, LLP

(57) ABSTRACT

An electronic apparatus according to the present embodiment is removably installed on a docking apparatus provided with a guide pin, via the guide pin. The electronic apparatus includes a main body and a cover. The main body includes a frame having a threaded hole for fastening, a display mounted thereon, and an insertion hole into which the guide pin is inserted. The cover has a screw inserting hole formed in and penetrating an opposite surface that lies opposite to the docking apparatus when the electronic apparatus is installed on the docking apparatus, and the cover has a guide opening formed in the opposite surface in communication with the insertion hole in the frame. The cover is fastened to the main body using the fastening screw. The fastening screw is inserted through the screw inserting hole in the opposite surface and screwed into the threaded hole in the frame.

10 Claims, 5 Drawing Sheets

ELECTRONIC APPARATUS

CROSS REFERENCE TO RELATED APPLICATIONS

This application is based upon and claims the benefit of priority from the prior Japanese Patent Application No. 2014-176055, filed on Aug. 29, 2014, the entire contents of which are incorporated herein by reference.

FIELD

Embodiments described herein relate generally to an electronic apparatus.

BACKGROUND

In recent years, with the prevalence of tablet terminals, computer apparatuses have been developed which can be used like notebook personal computers by installing an electronic apparatus such as a tablet terminal on a docking apparatus (so-called 2-in-1 personal computers). In this case, the docking apparatus is provided with an input interface such as a keyboard or a touch pad.

The electronic apparatus is installed on the docking apparatus via guide pins of the docking apparatus. More specifically, the electronic apparatus has insertion holes for installation, and the docking apparatus includes the guide pins provided at a hinge thereof in a projecting manner. When the electronic apparatus is installed on the docking apparatus, the guide pins are inserted into the insertion holes of the electronic apparatus to allow the electronic apparatus to be supported on the docking apparatus. Since the guide pins are provided at the hinge of the docking apparatus, the electronic apparatus can be pivoted around a pivot shaft of the hinge. Thus, the electronic apparatus installed on the docking apparatus can be opened and closed like a cover of a notebook computer.

When opened or closed, the electronic apparatus is subjected, via the guide pins, to stress acting in a pivoting direction. Conventionally, to ensure rigidity against the stress, the docking apparatus side is provided with a rigidity enhancing structure that holds a lower portion of the electronic apparatus in a sandwiching manner to enhance the rigidity of the electronic apparatus.

However, the provision of the rigidity enhancing structure leads to an increase in the thickness of the computer apparatus by an amount equal to the thickness of the rigidity enhancing structure. This makes a reduction in thickness difficult.

DETAILED DESCRIPTION

An electronic apparatus according to the present embodiment is an electronic apparatus removably installed on a docking apparatus provided with a guide pin, via the guide pin. The electronic apparatus includes a main body and a cover. The main body includes a frame having a threaded hole for fastening and a display mounted on the frame, and has an insertion hole into which the guide pin is inserted. The cover has a screw inserting hole formed in an opposite surface that lies opposite to the docking apparatus when the electronic apparatus is installed on the docking apparatus, the screw inserting hole penetrating the opposite surface, and the cover has a guide opening formed in the opposite surface in communication with the insertion hole in the frame. The cover is fastened to the main body in a fastening manner using the fastening screw. The fastening screw is inserted through the screw inserting hole in the opposite surface and screwed into the threaded hole in the frame.

Embodiments will now be explained with reference to the accompanying drawings.

Figure 1:
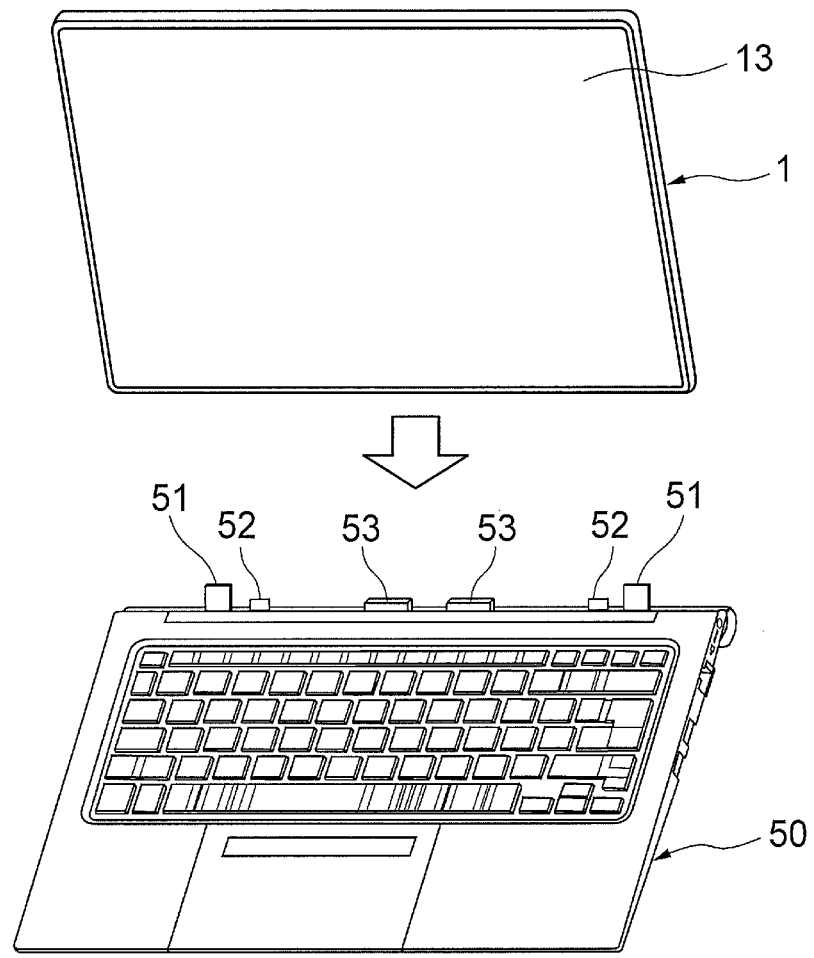
FIG. 1 is a general perspective view showing the appearance of an electronic apparatus 1 and a docking apparatus 50 according to an embodiment.

First, general configurations of an electronic apparatus 1 and a docking apparatus 50 will be described with reference to FIG. 1. FIG. 1 is a general perspective view showing the appearance of the electronic apparatus 1 and the docking apparatus 50 according to an embodiment. As shown in FIG. 1, the electronic apparatus 1 has a display 13 such as a liquid crystal display. For example, the electronic apparatus 1 is a tablet terminal with a touch panel as the display 13.

The docking apparatus 50 is provided with an input interface such as a keyboard or a touchpad. The electronic apparatus 1 is installed on the docking apparatus 50 at a hinge thereof. The electronic apparatus 1 may be installed not only such that the display 13 faces a front side (keyboard side) but also such that the display 13 faces a rear side.

As shown in FIG. 1, the hinge of the docking apparatus 50 is provided with guide pins 51, hooks 52, and connectors 53. The guide pins 51 are inserted through respective guide openings 33 described below (see FIG. 4A) into insertion holes (insertion holes 11 described below) provided in a side surface of the electronic apparatus 1 when the electronic apparatus 1 is installed on the docking apparatus 50. Thus, the electronic apparatus 1 is removably installed on the docking apparatus 50 via the guide pins 51.

The hooks 52 engage with respective hook engaging holes 36 (see FIG. 4A) provided in the side surface of the electronic apparatus 1 to fix the electronic apparatus 1 so as to prevent the electronic apparatus 1 from being detached from the docking apparatus 50. The connectors 53 are electrically connected to connectors (not shown) provided on the side surface of the electronic apparatus 1 when the electronic apparatus 1 is installed. The connectors 53 allow transmission of control signals and power exchanged between the electronic apparatus 1 and the docking apparatus 50. In this regard, the docking apparatus 50 is not limited to the docking apparatus with the input interface but may be, for example, a charging apparatus for the electronic apparatus 1.

Figure 2:
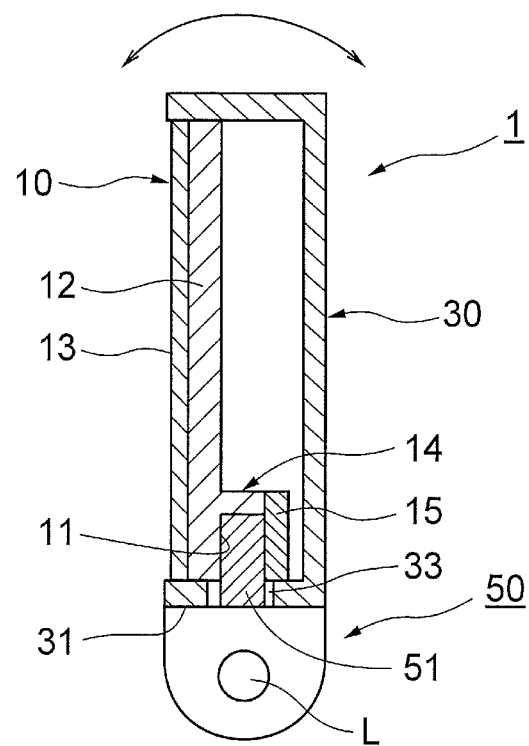
FIG. 2 is a cross-sectional view of the electronic apparatus 1 installed on the docking apparatus 50 via guide pins 51.

Now, the electronic apparatus 1 installed on the docking apparatus 50 will be described in detail with reference to FIG. 2. FIG. 2 is a cross-sectional view of the electronic apparatus 1 installed on the docking apparatus 50 via the guide pins 51.

As shown in FIG. 2, the electronic apparatus 1 includes a main body 10 and a cover 30 mounted on the main body 10.

The main body 10 has a frame (internal frame) 12 formed of a metal such as a magnesium alloy and a display 13 mounted on the frame 12, and a plate-like member 15 fixed to a guide 14 of the frame 12. The plate-like member 15 is formed of, for example, stainless steel and forms insertion holes 11 along with the guide 14. That is, each of the insertion holes 11 is defined by the frame 12 and the plate-like member 15 fixed to the frame 12 so as to cover the guide 14. In this regard, the insertion hole 11 may be integrally molded in the frame 12 without using the plate-like member 15.

As described above, the main body 10 has the insertion holes 11 through which the respective guide pins 51 of the docking apparatus 50 are inserted.

As shown in FIG. 2, the cover 30 is mounted on the main body 10 so as to expose the display 13 to the exterior and to house the frame 12 in the cover 30.

Furthermore, an opposite surface 31 that is a side surface of the cover 30 has the guide openings 33 as shown in FIG. 2. Here, the opposite surface 31 is a side surface that lies opposite to the docking apparatus 50 when the electronic apparatus 1 is installed on the docking apparatus 50. The guide openings 33 are in communication with the respective insertion holes 11 in the main body 10. The guide pins 51 of the docking apparatus 50 are inserted through the guide openings 33 into the insertion holes 11 to allow the electronic apparatus 1 to be supported on the docking apparatus 50. The electronic apparatus 1 can pivot around a pivot shaft L along with the hinge of the docking apparatus 50.

Figure 3:
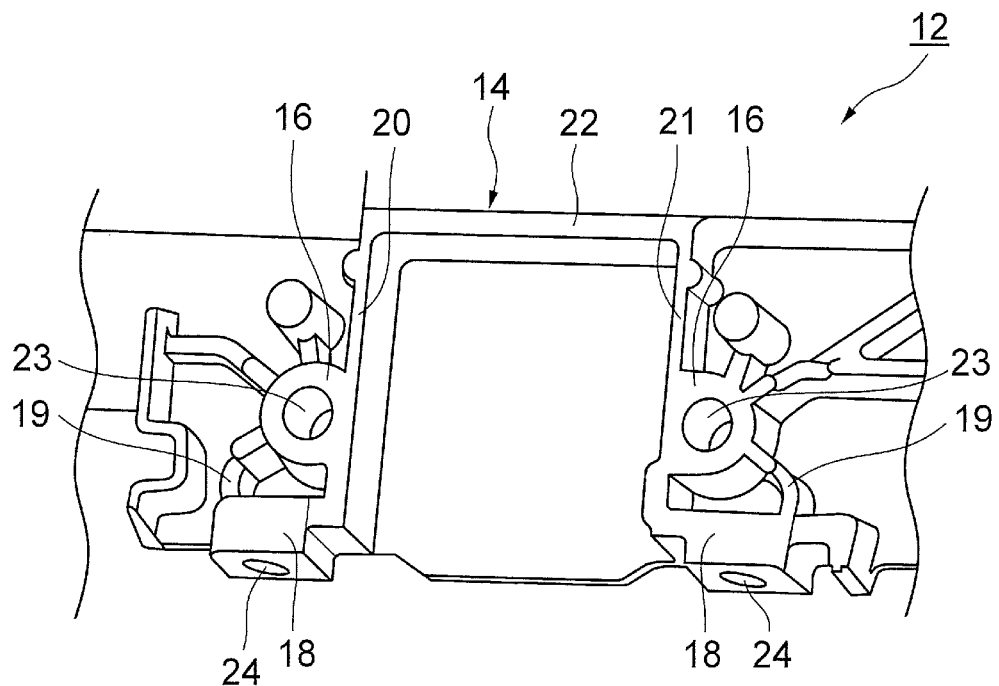
FIG. 3 is a partial perspective view of a frame 12 of the electronic apparatus 1 focusing on a guide 14.

Now, a configuration of the frame 12 will be described in detail with reference to FIG. 3. FIG. 3 is a partial perspective view of the frame 12 focusing on the guide 14.

As shown in FIG. 3, the frame 12 has guides 14 that allow the respective guide pins 51 of the docking apparatus 50 to be guided, plate-like member fixing bosses 16 with respective threaded holes 23 for fastening, and fastening bosses 18 with respective threaded holes 24.

As shown in FIG. 3, the guide 14 has a first wall 20, a second wall 21, and a third wall 22. The first wall 20 and the second wall 21 extend from an end (lower end) of the frame 12 in the direction of depth of the insertion holes 11. The third wall 22 connects an upper end of the first wall 20 and an upper end of the second wall 21 together.

As shown in FIG. 3, the plate-like member fixing bosses 16 are formed so as to project from outer side surfaces of the first wall 20 and the second wall 21, respectively. The threaded holes 23 in the plate-like member fixing bosses 16 are screwed over respective screws (screws 17 described below) that allow the plate-like member 15 to be fixed to the guide 14.

As shown in FIG. 3, the fastening bosses 18 are provided in the respective openings of the insertion holes 11 to connect to the guide 14. More specifically, the fastening bosses 18 are provided on the both sides of an opening end of the guide 14. Threaded holes 24 in the fastening bosses 18 are screwed over respective screws (screws 34 described below) used to fasten the main body 10 and the cover 30 together. The fastening bosses 18 are provided to connect to the guide 14 and are thus difficult to twist with respect to the frame 12. This enables an increase in the rigidity of the electronic apparatus 1.

In this regard, as shown in FIG. 3, the frame 12 may be provided with ribs 19 each connecting the plate-like member fixing bosses 16 and the fastening bosses 18 together, respectively. This enhances the structural strength of the plate-like member fixing bosses 16 and the fastening bosses 18, suppressing twist of the fastening bosses 18 with respect to the frame 12. As a result, this configuration can enhance resistance to stress exerted on the electronic apparatus 1 via the insertion holes 11 by the guide pins 51 when the electronic apparatus 1 installed on the docking apparatus 50 pivots around the pivot shaft L.

Figure 4A:
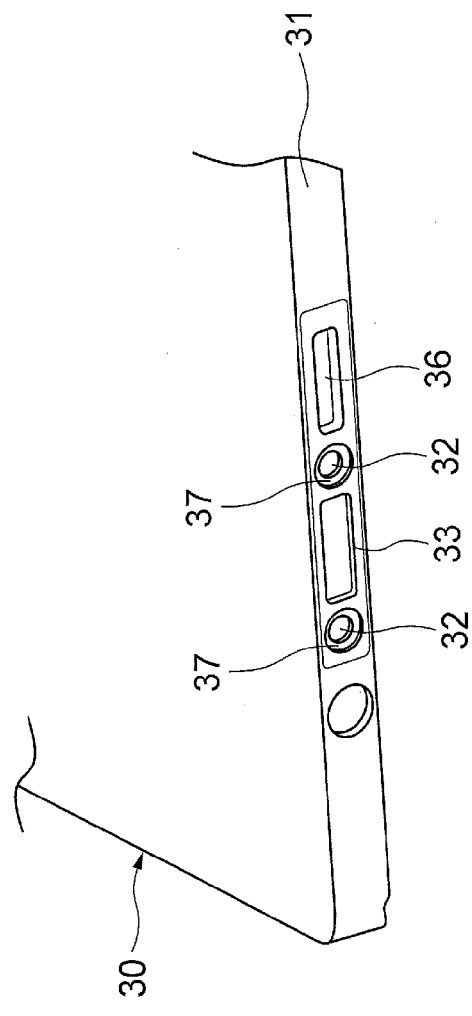
FIG. 4A is a partial perspective view of a cover 30 of the electronic apparatus 1.
Figure 4B:
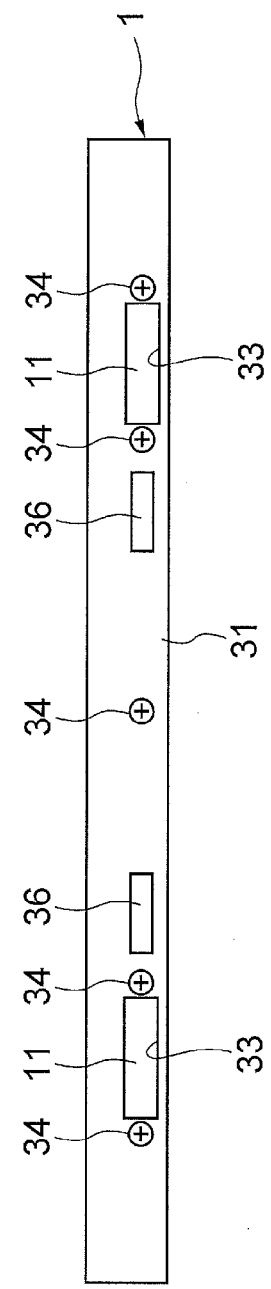
FIG. 4B is a side view of the electronic apparatus 1.

Now, a configuration of the cover 30 will be described in detail with reference to FIG. 4A and FIG. 4B. FIG. 4A is a partial perspective view of the cover 30. FIG. 4B is a side view of the electronic apparatus 1.

As shown in FIG. 4A, the opposite surface 31 of the cover 30 has, in addition to the screw inserting holes 32 penetrating the opposite surface 31, the guide openings 33 through which the respective guide pins 51 are inserted, and the hook engaging holes 36 that engage with the respective hooks 52. As shown in FIG. 4B, screws 34 that are screwed into the respective threaded holes 24 in the fastening bosses 18 are inserted through the respective threaded holes 24.

Furthermore, as shown in FIG. 4B, a plurality of the insertion holes 11 are formed in the opposite surface 31 at symmetric positions with respect to the center of the opposite surface 31. This allows the electronic apparatus 1 to be installed on the docking apparatus 50 so as to face either forward or rearward.

As shown in FIG. 4A, the opposite surface 31 of the cover 30 may have counterbores 37 in which heads of the respective screws 34 are housed. This prevents the heads of the screws 34 from protruding out from the opposite surface 31, allowing the electronic apparatus 1 to be installed on the docking apparatus 50 without backlash.

Furthermore, a plurality of the screw inserting holes 32 are provided in the opposite surface 31 at symmetric positions with respect to the center of the opposite surface 31. As shown in FIG. 4B, the screws 34 are inserted into the respective screw inserting holes 32. This precludes a disposition condition for the screws 34 from being changed depending on an installation direction of the electronic apparatus 1 (whether the electronic apparatus 1 faces forward or rearward). As a result, approximately the same rigidity can be achieved in both installation directions.

Additionally, the screw inserting hole 32 may be formed also at the center of the opposite surface 31, as shown in FIG. 4B, and the screw 34 may be inserted through the screw inserting hole 32 at the center. This enables a further increase in the strength of the joint between the cover 30 and the frame 12 fastened together.

Figure 5:
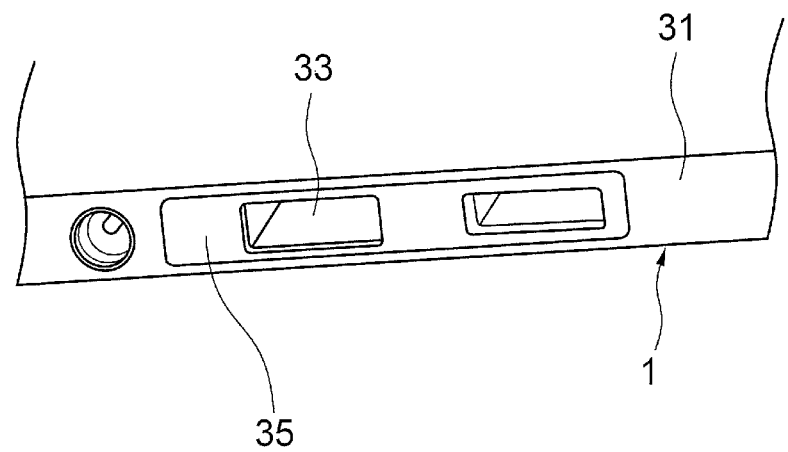
FIG. 5 is a partial perspective view of the electronic apparatus 1 with a seal member 35 stuck to an opposite surface 31 thereof.

As shown in FIG. 5, seal members 35 (formed of, for example, polycarbonate) may be provided so as to cover the heads of the screws 34. This enables the opposite surface 31 to be prevented from being damaged by the guide pins 51, and allows the fastening screws 34 to be prevented from becoming loose.

Preferably, each of the seal members 35 is provided in a recess in the opposite surface 31, and has a surface substantially flush with the opposite surface. The recess is formed in an area on the opposite surface 31 to which the seal member 35 is stuck. The screw inserting holes 32 are exposed at a bottom surface of the recess. When the seal member 35 is thus provided in the recess in the opposite surface 31, the seal member 35 is prevented from protruding out from the opposite surface 31 and the opposite surface 31 can be made flat.

Figure 6:
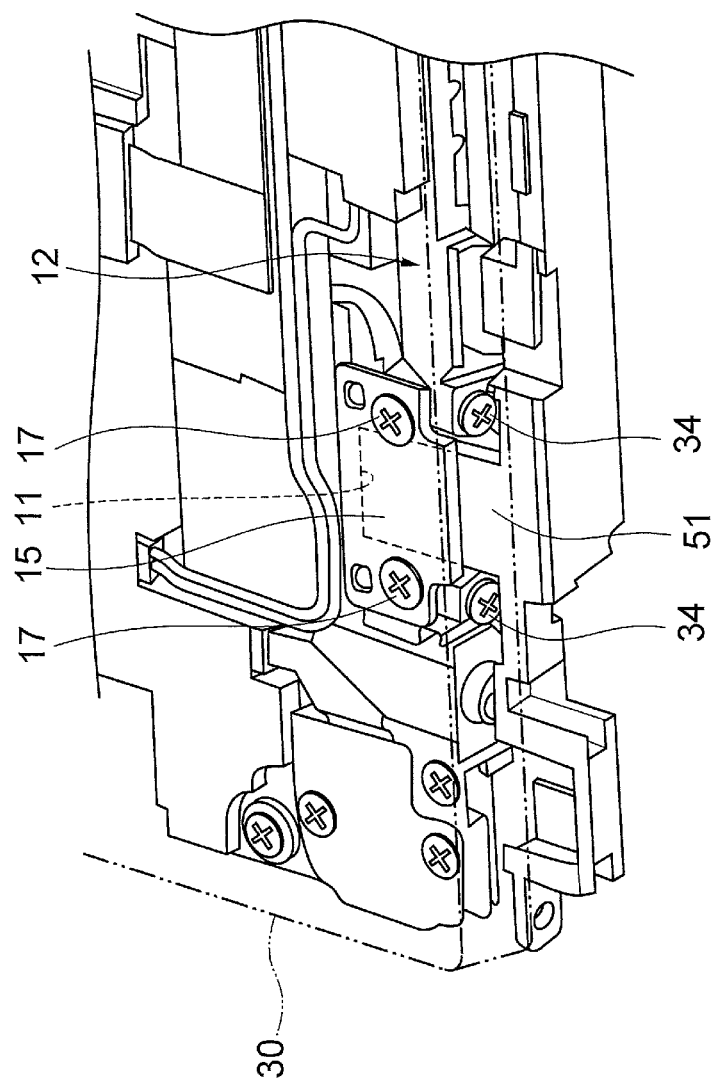
FIG. 6 is a perspective view showing the internal structure of the electronic apparatus 1 installed on the docking apparatus 50.

Now, the joint fastening of the main body 10 and the cover 30 using the screws 34 will be described with reference to FIG. 6. FIG. 6 is a perspective view showing an internal configuration of the electronic apparatus 1 installed on the docking apparatus 50. In FIG. 6, in order to show the internal configuration of the electronic apparatus 1, the cover 30 is shown transparent using an alternate long and two short dashes line.

As shown in FIG. 6, the plate-like member 15 is fixed to the frame 12 using the screws 17 that are screwed into the respective threaded holes 23 in the plate-like member fixing bosses 16.

As shown in FIG. 6, the cover 30 is fastened to the main body 10 using the screws 34. The screws 34 used to fasten the main body 10 and the cover 30 together are inserted through the respective screw inserting holes 32 described with reference to FIG. 4B and screwed into the respective threaded holes 24 in the frame 12 described with reference to FIG. 3.

As described above, in the electronic apparatus 1 according to the embodiment, the main body 10 and the cover 30 are fastened together using the screws 34 inserted through the opposite surface 31, which is a side surface of the cover 30, and screwed into the respective threaded holes 24 in the frame 12. Consequently, when the electronic apparatus 1 is opened or closed, that is, when the electronic apparatus 1 is pivoted around the pivot shaft L of the hinge of the docking apparatus 50, the stress exerted on the electronic apparatus 1 via the guide pins 51 can be distributed between the frame 12 of the main body 10 and the cover 30. As a result, the resistance of the electronic apparatus 1 to the stress exerted via the guide pins 51 can be enhanced. Thus, the cover 30 can be prevented from, for example, being detached from the main body 10 particularly at the opposite surface 31 and the neighborhood thereof when the electronic apparatus 1 is opened or closed.

Hence, according to the present embodiment, rigidity necessary for opening and closing the electronic apparatus 1 can be secured, without providing the docking apparatus 50 with a rigidity enhancing structure that enhances the rigidity of the electronic apparatus 1.

Furthermore, according to the present embodiment, it is not necessary to provide the docking apparatus 50 with a rigidity enhancing structure, thus the thickness of a computer apparatus with the electronic apparatus 1 and the docking apparatus 50 can be reduced. That is, according to the embodiment, rigidity for the electronic apparatus 1 is ensured while the thickness of the computer apparatus is reduced.

Moreover, according to the present embodiment, the fastening screws 34 are screwed into the respective threaded holes 24 extending perpendicularly to a pivoting direction of the electronic apparatus 1. Thus, according to the present embodiment, when the screws 34 become loose, the rigidity needed when the electronic apparatus 1 is opened or closed can be prevented from decreasing significantly.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. An electronic apparatus removably installed on a docking apparatus with a guide pin, via the guide pin, the electronic apparatus comprising:
   a main body comprising a frame with a threaded hole for fastening and a display mounted on the frame, and an insertion hole configured to accept the guide pin; and
   a cover comprising:
      a screw inserting hole penetrating an opposite surface to the docking apparatus when the electronic apparatus is installed on the docking apparatus; and
      a guide opening in the opposite surface connected with the insertion hole in the frame, wherein the cover is fastened to the main body with the screw inserted through the screw inserting hole in the opposite surface into the threaded hole in the frame.

2. The electronic apparatus of claim 1, wherein the frame comprises a guide configured to guide the guide pin of the docking apparatus, and
   the main body further comprises a plate-like member configured to cover the guide and to form the insertion hole along with the guide.

3. The electronic apparatus of claim 2, wherein the frame further comprises a plate-like member fixing boss with a threaded hole, and
   the plate-like member is fixed to the frame using a screw screwed into the threaded hole in the plate-like member fixing boss.

4. The electronic apparatus of claim 3, wherein the frame further comprises a rib configured to connect a fastening boss with the threaded hole for fastening and the plate-like member fixing boss together.

5. The electronic apparatus of claim 4, wherein the fastening boss is at an opening of the insertion hole so as to connect to the guide.

6. The electronic apparatus of claim 3, wherein the guide comprises a first wall and a second wall each extending from an end of the frame in a depth direction of the insertion hole, and a third wall configured to connect another end of the first wall and another end of the second wall together, and
   the plate-like member fixing boss is configured to project from an outer side surface of the first wall or the second wall.

7. The electronic apparatus of claim 1, wherein a counterbore in which a head of the fastening screw is housed is at the opposite surface.

8. The electronic apparatus of claim 1, wherein a plurality of the screw inserting holes are at symmetric positions with respect to the center of the opposite surface, and the fastening screw is inserted through each of the screw inserting holes.

9. The electronic apparatus of claim 1, wherein a seal is on the opposite surface so as to cover the head of the fastening screw.

10. The electronic apparatus of claim 9, wherein the seal is in a recess in the opposite surface, and the seal comprises a surface substantially flush with the opposite surface.

* * * * *